(12) United States Patent  
Huang et al.

(10) Patent No.: US 6,650,006 B2
(45) Date of Patent: Nov. 18, 2003

(54) SEMICONDUCTOR PACKAGE WITH STACKED CHIPS

(75) Inventors: Chien-Ping Huang, Hsinchu-Hsien (TW); Tzong-Da Ho, Taichung (TW); Cheng-Hsu Hsiao, Nantou (TW)

(73) Assignee: Siliconware Precision Industries Co., Ltd. (TW)

(*) Notice: Subject to any disclaimer, the term of this patent is extended or adjusted under 35 U.S.C. 154(b) by 0 days.

(21) Appl. No.: 09/922,270

(22) Filed: Aug. 3, 2001

(65) Prior Publication Data

US 2002/0175401 A1 Nov. 28, 2002

(30) Foreign Application Priority Data

May 25, 2001 (TW) .......................... 90112594 A

(51) Int. Cl.⁷ .......................... H01L 23/02; H01L 23/34
(52) U.S. Cl. .......................... 257/686; 257/777; 257/782; 257/707; 257/718
(58) Field of Search .......................... 257/685, 686, 257/690, 706, 707, 712, 718, 777, 782, 783, 784, 786, 723

(56) References Cited

U.S. PATENT DOCUMENTS 5,721,452 A 2/1998 Fogal et al. ................ 257/685
6,215,193 B1 4/2001 Tao et al. .................. 257/777
2001/0013643 A1 * 8/2001 Nakanishi et al. .......... 257/678

* cited by examiner

Primary Examiner—Minh Lean Tran
(74) Attorney, Agent, or Firm—Peter F. Corless; Steven M. Jensen; Edwards & Angell, LLP

(57) ABSTRACT

A semiconductor package with stacked chips is proposed, in which a first chip mounted on and electrically connected to a chip carrier is attached with a rigid interposer thereto, while the rigid interposer has a second chip disposed thereon in a manner that the rigid interposer is interposed between the first chip and the second chip. With the use of the rigid interposer, the second chip stacked on the first chip can be positioned in planarly parallel to the chip carrier, allowing bonding wires for electrically connecting the second chip to the chip carrier to be bonded completely. Moreover, the second chip has portions thereof not located right above the first chip to be firmly supported by the rigid interposer, and thus the second chip can be prevented from cracking in the wire bonding process. Furthermore, on the chip carrier there is formed an encapsulant for encapsulating the first chip, the second chip and part of the chip carrier where the first and second chips are electrically connected thereto,

20 Claims, 4 Drawing Sheets

SEMICONDUCTOR PACKAGE WITH STACKED CHIPS

FIELD OF THE INVENTION

The present invention relates to semiconductor packages, and more particularly, to a semiconductor package having at least two chips disposed in a stacked manner therein.

BACKGROUND OF THE INVENTION

It is desired to develop a highly-integrated semiconductor chip with enhanced performance and functions used in electronic products. That is, more electronic components need to be integrated on a semiconductor chip of a certain dimension. However, such a semiconductor chip requires a high integration process in fabrication, which makes the fabricating cost increased, while the fabricating rate is not correspondingly improved.

In accordance with the abovementioned problem, U.S. Pat. Nos. 5,721,452, and 6,215,193 B1 disclose a semiconductor package, in which two chips are disposed on a chip carrier such as a substrate or a lead frame in a stacked manner, as shown in FIG. 1. In such a conventional semiconductor chip 1, a first chip 10 is mounted on a chip carrier 11, and then two supporting elements 12, 12 are attached to an upper surface 110 of the chip carrier 11 in a manner that the two supporting elements 12, 12 are respectively spaced from side edges of the first chip 10. Then, a second chip 13 is disposed on the first chip 10 in a perpendicularly stacked manner, while portions of the second chip 13 not contacting the first chip 10 are attached to the supporting elements 12, 12 respectively for supporting. This makes bond pads 130 on the second chip 13 stably held, which is beneficial for bonding of bonding wires 14.

However, problems described as follows have been found in the foregoing semiconductor package. First, the second chip 13 is attached to the first chip 10 through an adhesive layer 15, while the adhesive layer 15 remains soft before carrying out a curing process. This therefore makes it difficult to control a top surface 150 of the adhesive layer 15 to be coplanarly positioned with a top surface 120 of the supporting element 12. In such a case, problems are generated after the second chip 13 is attached to the adhesive layer 15. For example, if the top surface 120 of the supporting element 12 is higher than the top surface 150 of the adhesive layer 15, voids and accordingly a popcorn effect will be generated due to the incomplete attachment of the second chip 13 to the adhesive layer 15. Further, if the top surface 120 of the supporting element 12 is lower than the top surface 50 of the adhesive layer 15 the portions of the second chips 13 not contacting the first chip 10 can not be adequately supported by the supporting elements 12, making the second chip 13 possibly cracking and the bonding of the bonding wires 14 to the bond pads 13 on the second chip 13 deteriorated in a wire bonding process.

Moreover, coplanarity is hard to be achieved between the top surfaces 120, 120 of the supporting elements 12, 12. In the condition of the top surfaces 120, 120 being in different elevation, the second chip 13 attached to the top surface 120, 120 will be slopingly positioned with respect to the upper surface 110 of the chip carrier 11, which detrimentally affects the bonding quality of the bonding wires 14.

Furthermore, during a molding process, the supporting elements 12 interposed between the second chip 13 and the chip carrier 11 will impede the flow of a molding resin, which tends to form voids in a gap between the second chip 13 and the chip carrier 11, and subsequently generate a popcorn effect.

In addition, heat produced by the first chip 10 will be transmitted to the second chip 13, while the heat increased in the second chip 13 can not be effectively dissipated making the second chip 13 undesirably affected in electrical performance.

Finally, in the semiconductor package 1, since the first chip 10 and the second chip 13 are perpendicularly stacked with the supporting elements 12 supporting the second chip 13, if a third chip is preferable to be disposed on the second chip 13 in a perpendicularly stacked manner, then neither forming supporting elements for supporting the third chip nor bonding of bonding wires can be successfully carried out, which restricts the semiconductor package 1 to accommodating two chips only.

SUMMARY OF THE INVENTION

A primary objective of the present invention is to provide a semiconductor package with stacked chips, in which the chips can be stacked in plenarily parallel on a chip carrier for assuring bonding quality of bonding wires. Further, the semiconductor package of the invention allows an upper chip to be firmly held without the need of supporting elements, while the upper chip can further be prevented from cracking in a wire bonding process, and voids can be prevented from forming in a molding resin used to fill a gap between the upper chip and the chip carrier in a molding process. Moreover, the invention allows the semiconductor package to accommodate at least two chips stacked therein as well as makes heat generated in the semiconductor package effectively dissipated.

In accordance with the above and other objectives, a semiconductor package with stacked chips is proposed in the present invention, including a chip carrier; at least one first chip attached to the chip carrier and electrically connected to the chip carrier, while the first chip has an active surface including an attachment area and at least one bond pad area adjacent to the attachment area; at least one second chip having an active surface and an inactive surface, while the active surface includes an attachment area for mounting at least one chip thereon, and at least one bond pad area adjacent to the attachment area for electrically connecting the second chip to the chip carrier, whereas on the inactive surface there is disposed a rigid interposer for mounting the second chip on the attachment area of the first chip with the rigid interposer interposed between the first chip and the second chip, and the bond pad area of the second chip disposed in a position not right above the first chip is sufficiently supported by the rigid interposer in a manner that the bond pad area of the first chip is exposed to outside of the second chip and the rigid interposer; and an encapsulant for encapsulating the first and second chips.

The rigid interposer can be made of a nonmetallic or metallic material in a predetermined thickness for having sufficient rigidity for supporting the second chip and preventing the second chip from cracking during a wire bonding process. Further, in order to effectively dissipate heat produced by the first chip and improve the heat dissipating efficiency of the semiconductor package, the rigid interposer is preferably made of a metallic material such as copper, aluminum, copper alloy and aluminum alloy. Moreover, the rigid interposer can be formed in surface area larger than that of the second chip for providing an enlarged heat dissipating area for the first and second chips, so as to farther enhance the heat dissipating efficiency. Furthermore, with the use of the rigid interposer for heat dissipation, on at least one side edge of the rigid interposer there can be formed an upwardly extending portion in a manner of not interfering with the exposure of the bond pad area of the first chip. The extending portion is used to increase the heat dissipating area, and further the extending portion can be formed with a lateral portion having a top surface thereof exposed to outside of the encapsulant, allowing heat to be transmitted from the first and second chips through the lateral portion of the rigid interposer for being dissipated to the atmosphere, so as to even further improve the heat dissipating efficiency In addition, with no need of supporting elements for supporting the second chip on the chip carrier as previously depicted in the prior art, at least one third chip can be mounted on the attachment area of the second chip in a manner of not affecting the electrical connecting of the chips to the chip carrier; that is, the semiconductor package of the invention can accommodate two, three, four or more chips stacked therein.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

Figure 1:
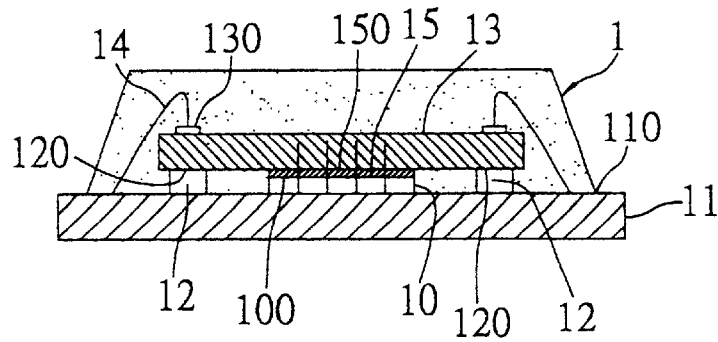
FIG. 1 (PRIOR ART) is a sectional view of a conventional semiconductor package with stacked chips.
Figure 2:
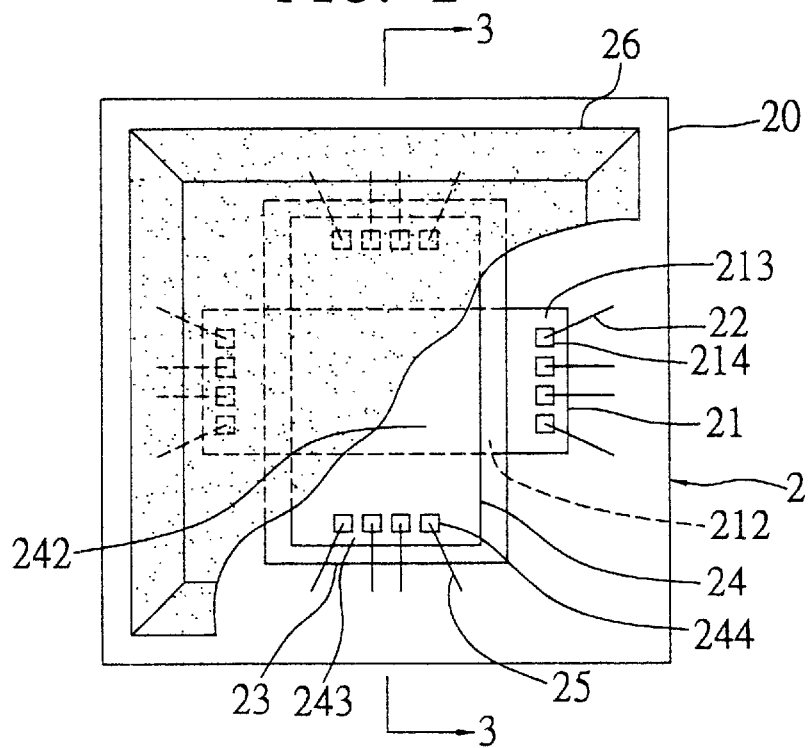
FIG. 2 is a top view of the semiconductor package in the first preferred embodiment of the invention.
Figure 3:
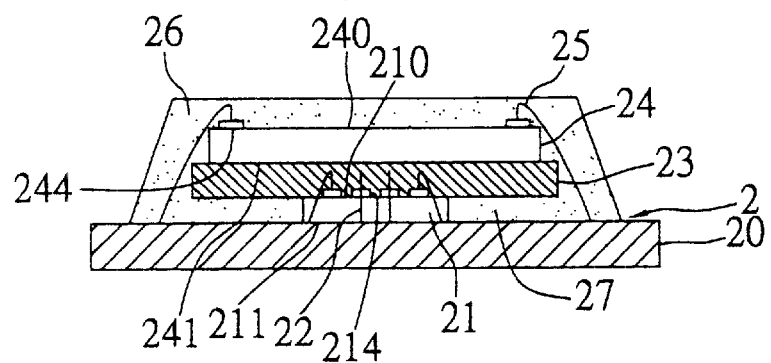
FIG. 3 is a sectional view of FIG. 2 cutting along a line 3—3.

Illustrated in FIG. 2 and FIG. 3 are respectively a top view and a sectional view of the semiconductor package in the first embodiment of the invention.

As shown in the drawing, the semiconductor package 2 of the first embodiment includes a chip carrier 20, a first chip 21 mounted on the chip carrier 20, a plurality of first gold wires 22 for electrically connecting the first chip 21 to the chip carrier 20, a rigid interposer 23 attached to the first chip 21 in a perpendicularly stacked manner, a second chip 24 disposed on the rigid interposer 23 at a perpendicular position to the first chip 21, a plurality of second gold wires 25 for electrically connecting the second chip 24 to the chip carrier 20, and an encapsulant 26 for encapsulating the first chip 21, the first gold wires 22, the second chip 24, and the second gold wires 25.

The chip carrier 20 can be a conventional lead frame or substrate. If the chip carrier 20 is a lead frame, the first chip 21 is mounted on a die pad or inner leads of a plurality of leads of the lead frame, while the first gold wires 22 and the second gold wires 25 are bonded to the corresponding leads for electrically connecting the first chip 21 and the second chip 24 to external devices through the leads. If the chip carrier 20 is a substrate, the first chip 21 and the second chip 24 are electrically connected to external devices through a plurality of solder balls implanted on the substrate. As the chip carrier 20 can be a conventional lead frame, substrate or a structure for sufficiently holding the chips 21 and 24 without other requisites, a simplified drawing for the chip carrier of the invention is demonstrated herewith.

The first chip 21 has an active surface 210 and an opposing inactive surface 211. The active surface 210 includes an attachment area 212 formed at an approximately central position thereof, and bond pad areas 213 formed at positions outside two sides of the attachment area 212. Further, on the bond pad areas 213 there is disposed a plurality of bond pads 214 for bonding the first gold wires 22 thereto so as to electrically connect the first chip 21 to the chit carrier 20. Moreover, the inactive surface 211 is attached to a predetermined position on the chip carrier 20 through an adhesive (not shown) such as silver paste.

The rigid interposer 23 is formed as a flat rectangular plate of a predetermined thickness, and can be made of a material such as ceramics, thermosetting resin, or metal. This is to provide the rigid interposer 23 with sufficient rigidity for firmly supporting the second chip 24 mounted thereon and for preventing the second chip 24 from cracking during a wire bonding process. Nevertheless, the rigid interposer 23 is preferably made of metal for improving the heat dissipating efficiency of the semiconductor package 2. Moreover, the rigid interposer 23 has a lower surface (not designated by a reference numeral) attached to the attachment area 212 of the first chip 21, while the rigid interposer 23 has its longitudinal direction perpendicular arranged to that of the first chip 21. This makes the bond pad areas 213 of the active surface 210 of the first chip 21 not covered by the rigid interposer 23 so as not to affect the bonding of the first gold wires 22.

The second chip 24 is attached to an upper spice (not designated by a reference numeral) of the rigid interposer 23 through a conventional adhesive. As the rigid interposer 23 is flatly formed, the plenarily parallel attachment of the second chip 24 to the rigid interposer 23 and of the rigid interposer 23 to the first chip 21 can be ideally accomplished. Thus, the second chip 24 mounted on the first chip 21 through the rigid interposer 23 is positioned in pliantly parallel to the chip carrier 20, which allows the second gold wires 25 for electrically connecting the second chip 24 to the chip carrier 20 to be assured in bonding quality, and accordingly a problem of deteriorating the bonding quality due to the chip not in plenarily parallel to the chip carrier can be eliminated.

Moreover, the second chip 24 has an active surface 240 and an opposing inactive surface 241. On the active surface 240 there are formed an attachment area 242 at an approximately central position for attaching an upper or a third chip (not shown, but will be detailed in the fourth embodiment) thereto, and bond pad areas 243 at positions outside two sides of the attachment area 242 for bonding the second gold wires 25 to a plurality of bond pads 244 formed on the bond pad areas 243 so as to electrically connect the second chip 24 to the carrier 20. As the second chip 24 has its longitudinal direction parallel to that of the rigid interposer 23, that is, the second chip 24 is perpendicularly arranged with respect to the first chip 21, the bond pad areas 243 of the second chip 24 not located right above the first chip 21 can be sufficiently supported by the rigid interposer 23, so that the second chip 24 can be prevented from cracking during the wire bonding of the second gold wires 25. Furthermore, with the firm support from the rigid interposer 23 for the second chip 24, there is no need of using supporting elements for supporting the second chip as recited in the prior art. Therefore, the problems in the prior art of difficulty in achieving the planarity of the second chip 24 with respect to the first chip 21 and accordingly degradation in the wire bonding quality can be eliminated. Moreover, compared with the prior art having the second chip attached to both the first chip and the supporting elements, the semiconductor package of the invention is more advantageous in fabrication as the second chip 24 is mounted on the first chip 21 through the rigid interposer 23. In addition, with no use of the supporting elements, in a molding process for forming the encapsulant 26, the impediment to the flow of a molding resin due to the supporting elements as depicted in the prior art can be avoided, and thus voids as well as a popcorn effect can be prevented from occurrence in the molding resin when filling a gap 27 between the rigid interposer 23 and the chip carrier 20.

The attachment of the second chip 24 to the rigid interposer 23 can be implemented after or prior to the rigid interposer 23 attached to the first chip 21. As shown in FIGS. 2, and 3, the rigid interposer 23 has a larger surface area than the second chip 24 so that the rigid interposer 23 can provide a larger heat dissipating area for increasing the head dissipating efficiency if it is made of metal. However, the rigid interposer 23 is not necessarily larger in surface area than the second chip 24, whereas it can be equal to or smaller than the second chip 24 only if the second chip 24 can be effectively supported. Moreover, further due to the sufficient support provided by the rigid interposer 23, the second chip 24 can be used in reduced thickness so as to make the fabricated semiconductor package miniaturized in overall thickness.

Second Preferred Embodiment

Figure 4:
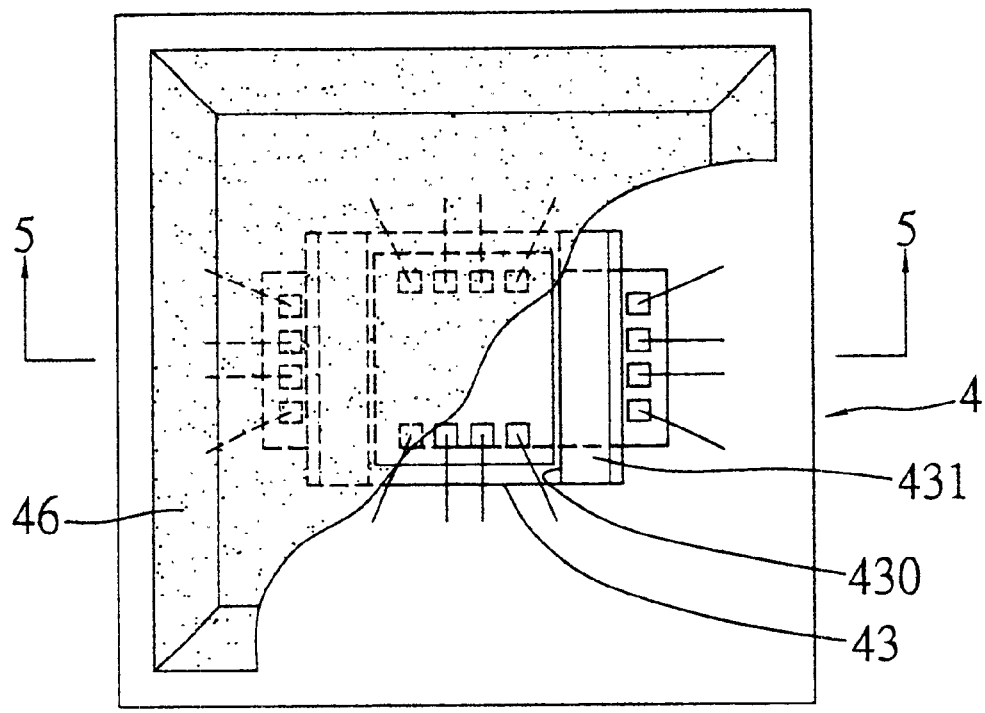
FIG. 4 is a top view of the semiconductor package in the second preferred embodiment of the invention.
Figure 5:
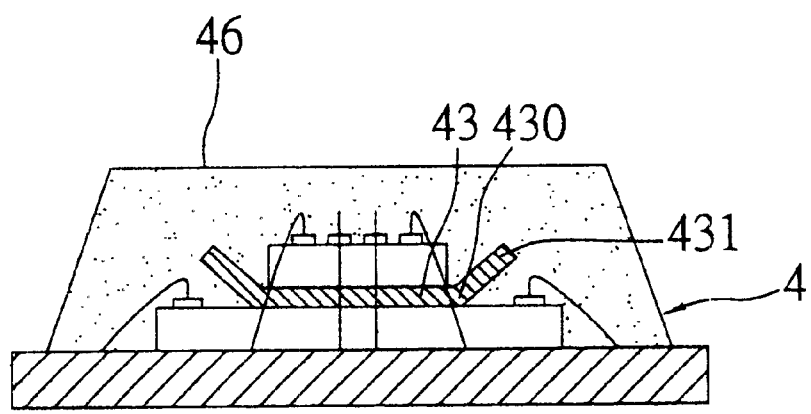
FIG. 5 is a sectional view of FIG. 4 cutting along a line 5—5.

Illustrated in FIG. 4 and FIG. 5 are respectively a top view and a sectional view of the semiconductor package in the second embodiment of the invention.

As shown in the drawing, the semiconductor package 4 of the second embodiment is substantially identical in structure to that of the first embodiment, with the only difference in that a rigid interposer of the semiconductor package 4 is a heat sink 43. The heat sink 43 is integrally formed with an extending portion 431 extending upwardly and outwardly at each longitudinal side edge 430 thereof This can help enhance the bonding of the heat sink 43 to the encapsulant 46, and provide extra heat dissipating area for improving the heat dissipating efficiency in the condition of no increase in the dimension of the semiconductor package 4. In addition, the extending portions 431 can be corrugated so as to further increase the heat dissipating area.

Third Preferred Embodiment

Figure 6:
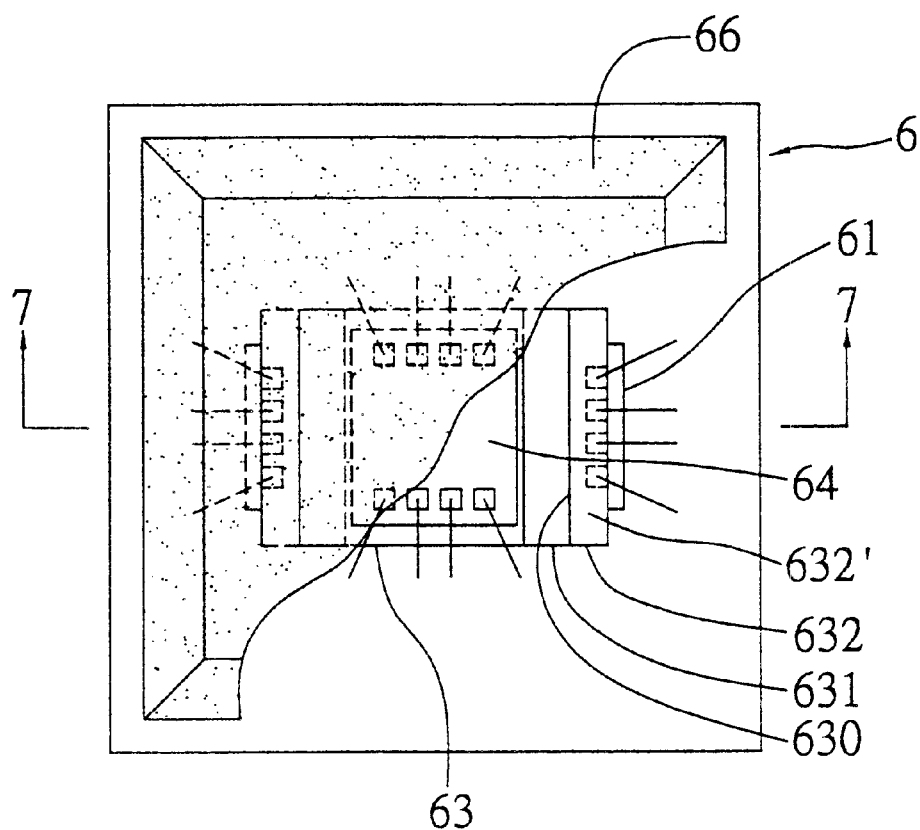
FIG. 6 is a top view of the semiconductor package in the third preferred embodiment of the invention.
Figure 7:
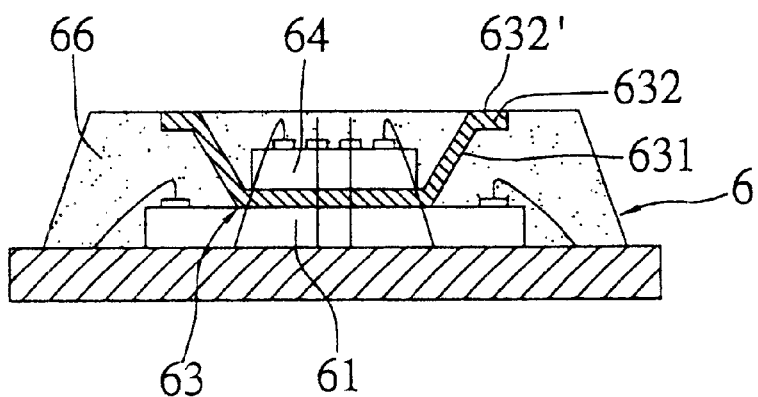
FIG. 7 is a sectional view of FIG. 6 cutting along a line 7—7.

Illustrated in FIG. 6 and FIG. 7 are respectively a top view and a sectional view of the semiconductor package in the third embodiment of the invention.

As shown in the drawing, the semiconductor package 6 of the third embodiment is substantially identical in structure to that in the first embodiment, with the only difference in that a rigid interposer of the semiconductor package 6 is a heat sink 63. The heat sink 63 is integrally formed with an extending portion 631 extending upwardly and outwardly at each longitudinal side edge 630 of the heat sink 63. Moreover, at a top portion of each extending portion 631 there is further formed a lateral portion 632 toward a direction away from a second chip 64 disposed on the heat sink 63. Besides providing the heat sink 63 with extra heat dissipating area, the lateral portions 632 can each has a top surface 632' exposed to outside of an encapsulant 66 encapsulating the first chip 61 and the second chip 64. This allows heat produced by the first and second chips 61 and 64 to be transmitted to the heat sink 63 and then directly dissipated to the atmosphere through the exposed lateral portion 632, and thus the semiconductor package 6 has better heat dissipating efficiency than those depicted in the first and second embodiments.

Fourth Preferred Embodiment

Figure 8:
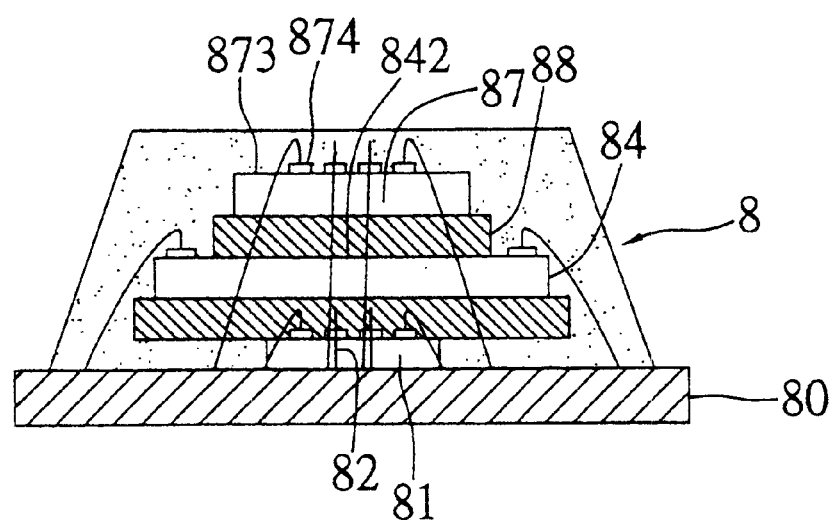
FIG. 8 is a sectional view of the semiconductor package in the fourth preferred embodiment of the invention.

Illustrated in FIG. 8 is a sectional view of the semiconductor package in the fourth embodiment of the invention.

The semiconductor package 8 of the fourth embodiment is substantially identical in structure to that in the first embodiment, with the only difference in that a third chip 87 is disposed on a second chip 84 in the semiconductor package 8, making the semiconductor package 8 having three chips stacked therein enhanced in electrical performance and capacity. The third chip 87 is similarly attached to an attachment area 842 of the second chip 84 through a rigid interposer 88, such that the rigid interposer 88 is interposed between the second chip 84 and the third chip 87. Further, the third chip 87 is disposed in a manner of not interfering with or contacting first gold wires 82 electrically connecting a first chip 81 to a chip carrier 80. Moreover, as the third chip 87 is perpendicularly arranged with respect to the second chip 84, bond pad areas 873 formed on the third chip 87 are not positioned right above the second chip 84 but can be held in position by the rigid interposer 88 without needing any supporting elements formed on the chip carrier 80.

Fifth Preferred Embodiment

Figure 9:
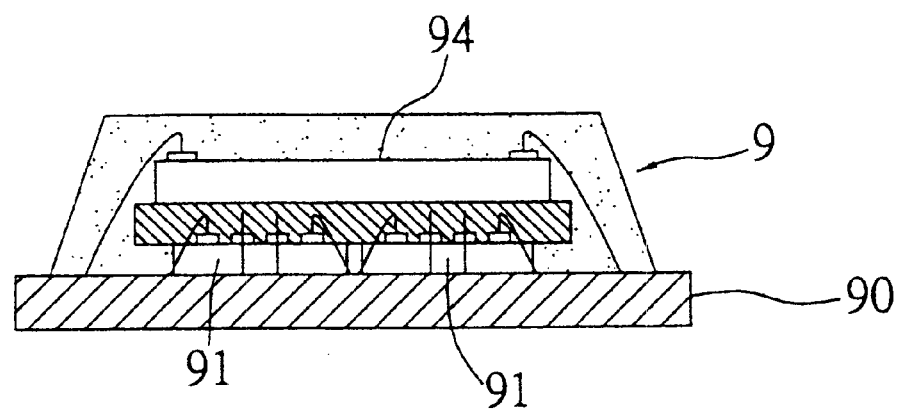
FIG. 9 is a sectional view of the semiconductor package in the fifth preferred embodiment of the invention.

Illustrated in FIG. 9 is a sectional view of the semiconductor package in the fifth embodiment of the invention.

The semiconductor package 9 of the fifth embodiment is structurally identical to that in the first embodiment, with the only difference in that a chip carrier 90 of the semiconductor package 9 has two first chips 91, 91 disposed in parallel thereon, that is, the semiconductor package 9 accommodates three chips including the two first chips 91, 91 and a second chip 94 mounted on the first chips 91, 91. This arrangement allows an upper chip to be properly stacked on a lower chip through a rigid interposer without needing any supporting elements formed on the chip carrier in the condition of different sized chips being used in the semiconductor package. Therefore, the semiconductor package can be provided with more flexibility in selecting and combining the chips of different sizes, that is, the semiconductor package has a broader range in application. In other words, it is also applicable for the semiconductor package to have two second chips disposed on a single first chip, or two second chips disposed on two first chips, and so on.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with stacked chips, comprising:
   a chip carrier;
   at least one first chip mounted on the chip carrier and electrically connected to the chip carrier, while the first chip has an active surface formed with an attachment area and at least one bond pad area thereon adjacent to the attachment area;
   at least one second chip having an active surface and an inactive surface, wherein the active surface includes at least one bond pad area for electrically connecting die second chip to the chip carrier, and the inactive surface is attached with a rigid interposer which is disposed on the attachment area of the first chip and thereby interposed between the first and second chips, the rigid interposer having a surface area at least equal to that of the second chip, while the second chip is sufficiently held in position above the first chip by the rigid interposer, making the bond pad area of the first chip exposed to outside of the rigid interposer and the second chip; and
   an encapsulant for encapsulating the first chip and the second chip.

2. The semiconductor package of claim 1, wherein the rigid interposer is made of thermally conductive metal.

3. The semiconductor package of claim 1, wherein the rigid interposer is made of ceramics.

4. The semiconductor package of claim 1, wherein the rigid interposer is made of thermosetting resin.

5. The semiconductor package of claim 1, wherein the rigid interposer is formed with an upwardly extending portion on at least one of opposing side edges thereof.

6. The semiconductor package of claim 5, wherein the extending portion of the rigid interposer is formed with a lateral portion extending laterally.

7. The semiconductor package of claim 6, wherein the lateral portion has a top surface exposed to outside of the encapsulant for directly contacting the atmosphere.

8. The semiconductor package of claim 1, wherein the rigid interposer is formed with oven surfaces for being attached to the first chip and the second chip respectively so as to position the second chip stacked on the first chip through the rigid interposer to be planarly parallel to the chip carrier.

9. The semiconductor package of claim 1, wherein on the bond pad areas of the first chip and the second chip there are respectively formed a plurality of bond pads used to bond bonding wires thereto so as to electrically connect the first chip and the seconds chip to the chip carrier.

10. The semiconductor package of claim 1, wherein the rigid interposer is a heat sink.

11. The semiconductor package of claim 1, wherein the active surface of the second chip further includes an attachment area for mounting at least one third chip thereon, the at least one bond pad area of the second chip located adjacent to the attachment area.

12. A semiconductor package with stacked chips, comprising:
    a chip carrier;
    at least one first chip mounted on die chip carrier and electrically connected to the chip carrier, the first chip having an active surface formed with an attachment area and at least one bond pad area thereon adjacent to the attachment area;
    at least one second chip having an active surface and an inactive surface, wherein the active surface includes at least one bond pad area for electrically connecting the second chip to the chip carrier;
    a rigid interposer having a first surface attached to the attachment area of the first chip and a second surface attached to the second chip, wherein the first chip, the interposer, and the second chip arc arranged in a stacked manner such that the bond pad area of the first chip is exposed to outside of the rigid interposer and the second chip, and the rigid interposer is formed with an extending portion protruding upwardly and outwardly from at least one side edge thereof and beyond the second chip; and
    an encapsulant for encapsulating the first chip and the second chip.

13. The semiconductor package of claim 12, wherein the active surface or the second chip further includes an attachment area for mounting at least one third chip thereon, the at least one bond pad area of the second chip located adjacent to the attachment area.

14. The semiconductor package of claim 12, wherein the rigid interposer is attached to the first chip in a perpendicularly stacked manner.

15. The semiconductor package of claim 14, wherein the second chip is attached to the rigid interposer in a planarly parallel manner, and the second chip is positioned planarly parallel to the chip carrier.

16. The semiconductor package of claim 12, wherein the second chip is attached to the rigid interposer in a planarly parallel manner, and the second chip is positioned planarly parallel to the chip carrier.

17. The semiconductor package of claim 12, wherein the rigid interposer is a heat sink.

18. The semiconductor package of claim 12, wherein the extending portion of the rigid interposer is formed with a lateral portion extending laterally.

19. The semiconductor package of claim 18, wherein the lateral portion has a top surface exposed to outside of the encapsulant for directly contacting the atmosphere.

20. A semiconductor package with stacked chips: comprising:
    a chip carrier;
    at least two first chips mounted in parallel on the chip carrier and electrically connected to the chip carrier, each of the first chips having an active surface formed with an attachment area and at least one bond pad area thereon adjacent to the attachment area;
    at least one second chip having an active surface and an inactive surface, wherein the active surface includes at least one bond pad area for electrically connecting the second chip to the chip carrier;
    a rigid interposer having a first surface attached to the attachment areas of the two first chips and a second surface attached to the inactive surface of the second chip, wherein the rigid interposer and the second chip are arranged in a stacked manner over the two first chips such that the bond pad area of each of the first chips is exposed to outside of the rigid interposer and the second chip; and
    an encapsulant for encapsulating the first chips and the second chip.

* * * * *